United States Patent [19]

O'Keefe, II

[11] 4,418,975
[45] Dec. 6, 1983

[54] ELECTRICAL CONNECTOR FOR A SLIDE-IN COMPONENT

[75] Inventor: John J. O'Keefe, II, Cortland, Ohio

[73] Assignee: General Motors Corporation, Detroit, Mich.

[21] Appl. No.: 294,212

[22] Filed: Aug. 17, 1981

[51] Int. Cl.³ .......................................... H01R 13/54
[52] U.S. Cl. ................................. 339/91 R; 339/205
[58] Field of Search ............................ 339/91 R, 205

[56] References Cited

U.S. PATENT DOCUMENTS

| | | | |
|---|---|---|---|
| 3,365,694 | 1/1968 | Parker | 339/91 R X |
| 3,530,424 | 9/1970 | Gregory | 339/91 R |
| 3,753,212 | 8/1973 | Yamada et al. | 339/91 R |
| 3,869,191 | 3/1975 | Tolnar, Jr. | 339/91 R X |
| 4,063,683 | 12/1977 | Jones | 339/91 R X |
| 4,083,620 | 4/1978 | Burgin | 339/91 R |
| 4,103,985 | 8/1978 | Krolak et al. | 339/91 R X |

Primary Examiner—Howard N. Goldberg
Assistant Examiner—Timothy V. Eley
Attorney, Agent, or Firm—F. J. Fodale

[57] ABSTRACT

An electrical connector for connecting a slide-in radio to a plurality of related, remotely located components by a plurality of wiring harnesses comprises, a plurality of connector blocks attached to respective wiring harnesses. The connector blocks are arranged in two longitudinally spaced laterally offset rows by a holder which is attached to a receptacle for the radio. The radio has a side mounted terminal block which has a plurality of terminal pads arranged to complement the connector blocks. The terminal pads and connector blocks each have a plurality of terminals which engage when the radio is mounted in the receptacle.

3 Claims, 6 Drawing Figures

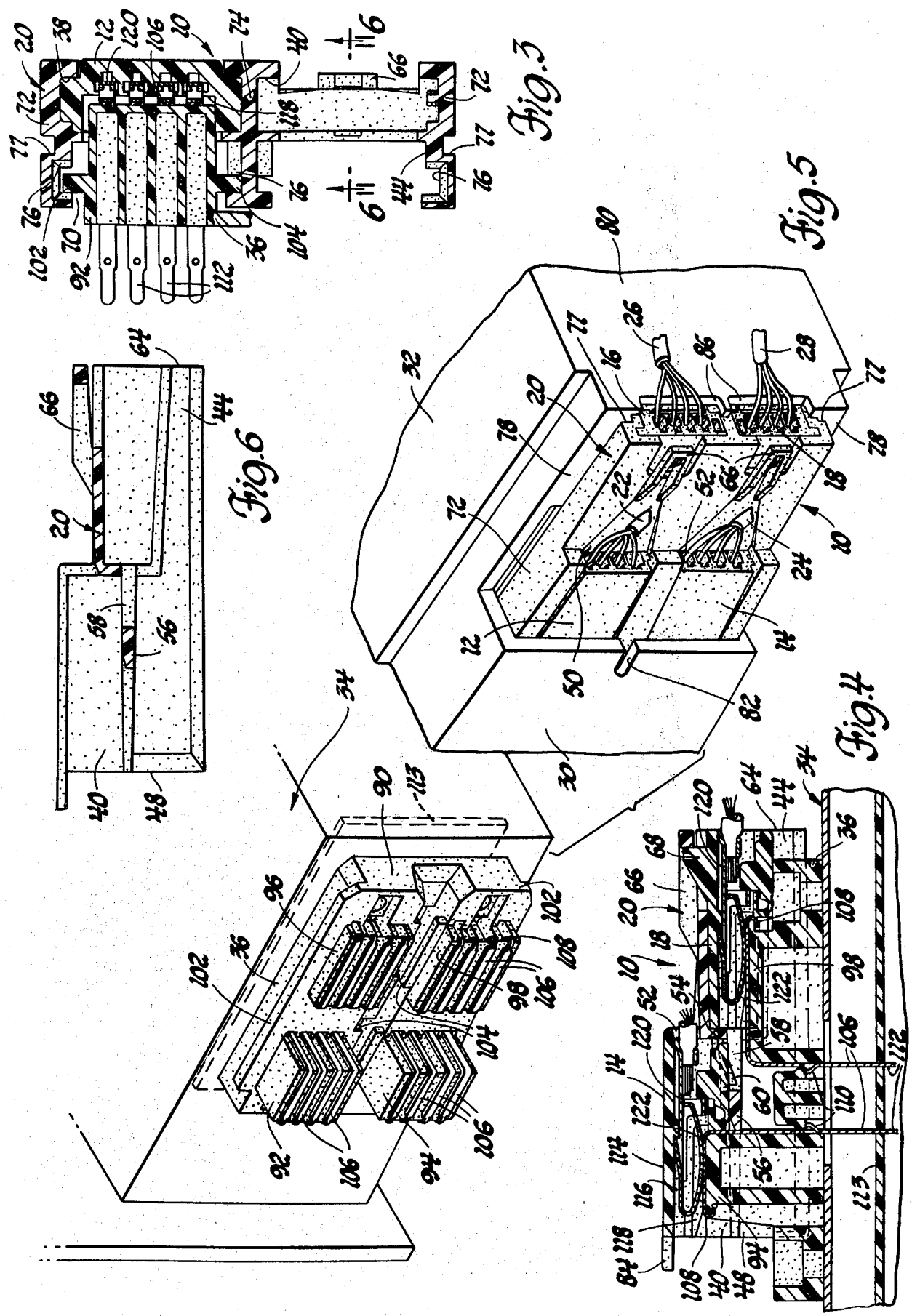

ELECTRICAL CONNECTOR FOR A SLIDE-IN COMPONENT

This invention relates to an electrical connector and, more particularly, to an electrical connector for a slide-in component of an electrical system which includes several other remotely located components.

For example, the electrical sound system in an automotive vehicle typically includes a dash mounted radio, an electrical power source in the engine compartment and speakers at various locations in the passenger compartment. The radio is commonly part of a built-up dash or instrument panel so that installation in or removal from the vehicle is tedious. However, in some instances, the radio slides into a support on the dash for ease of installation or removal. See for instance, U.S. Pat. No. 4,063,683 granted to Leslie R. Jones on Dec. 20, 1977 and U.S. Pat. No. 4,083,620 granted to Ralph C. Burgin on Apr. 11, 1978.

The object of this invention is to provide an electrical connector for a slide-in radio or the like, which is compact and at the same time has a capacity for making several electrical connections.

One feature of the invention is that several individual connector blocks are arranged and supported at one location so that several remotely located components can be connected to a radio or the like by wiring harnesses which can be conveniently routed in the vehicle.

Another feature of the invention is that the connector blocks are arranged and located at the side of the radio so that neither the height of the radio nor the depth of the radio receptacle need be increased.

Another feature of the invention is that the connector blocks are arranged in longitudinally spaced rows to fit a large number of connectors within a small height.

Another feature of the invention is that the connector blocks in one row are laterally offset from the connector blocks in another row to provide longitudinal exits for the wiring harnesses in the front row which avoids sharp bends in the wiring harnesses and reduces the length of the connector.

Another feature of the invention is that the connector blocks in one offset row partially overlap the connector blocks in the other offset row to save lateral space while retaining longitudinal exits for the wiring harnesses for the front row and provide a positive rearward stop for the connector blocks in the front row.

Another feature of the invention is a holder which detachably retains the connector blocks for attachment to a support structure as a unit.

Another feature of the invention is that some connector blocks are not detachable after the radio is mounted in the vehicle so that standard components, such as a power supply and a front speaker, cannot be disconnected after assembly line testing.

Another feature of the invention is that some connector blocks can be connected or disconnected after the radio is mounted in the vehicle so that optional components, such as rear seat speakers can be installed by the dealer.

Another feature of the invention is that the connector blocks have terminals with laterally engaging contacts to accommodate tolerance stack-up in the lateral direction.

Another feature of the invention is that the connector blocks are inserted into opposite ends of a holder which has two, laterally offset rows of chambers to provide a compact arrangement of connector blocks which are of substantially the same size, particularly thickness.

Other objects and features of the invention will become apparent to those skilled in the art as the disclosure is made in the following detailed description of a preferred embodiment of the invention as illustrated in the accompanying sheets of drawing in which:

FIG. 3 is a section taken substantially along the line 3—3 of FIG. 1 looking in the direction of the arrows.

FIG. 4 is a section taken substantially along the line 4—4 of FIG. 1 looking in the direction of the arrows.

FIG. 5 is an exploded view of a radio mounting incorporating the electrical connector shown in FIG. 1.

FIG. 6 is a section taken substantially along the line 6—6 of FIG. 3 looking in the direction of the arrows.

Figure 1:
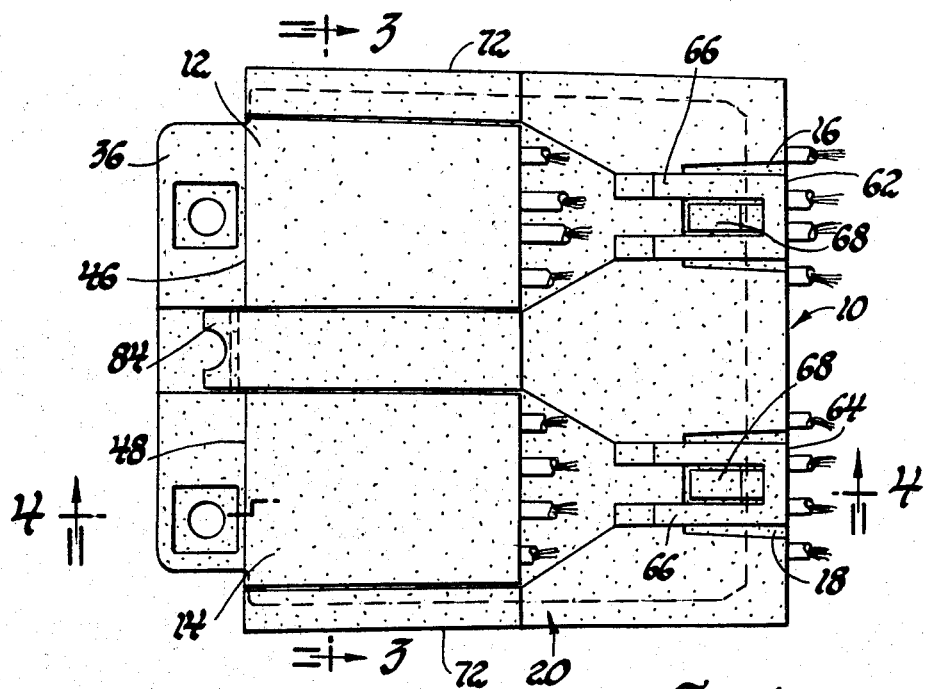
FIG. 1 is a side view of an electrical connector in accordance with this invention mated with a terminal block.
Figure 2:
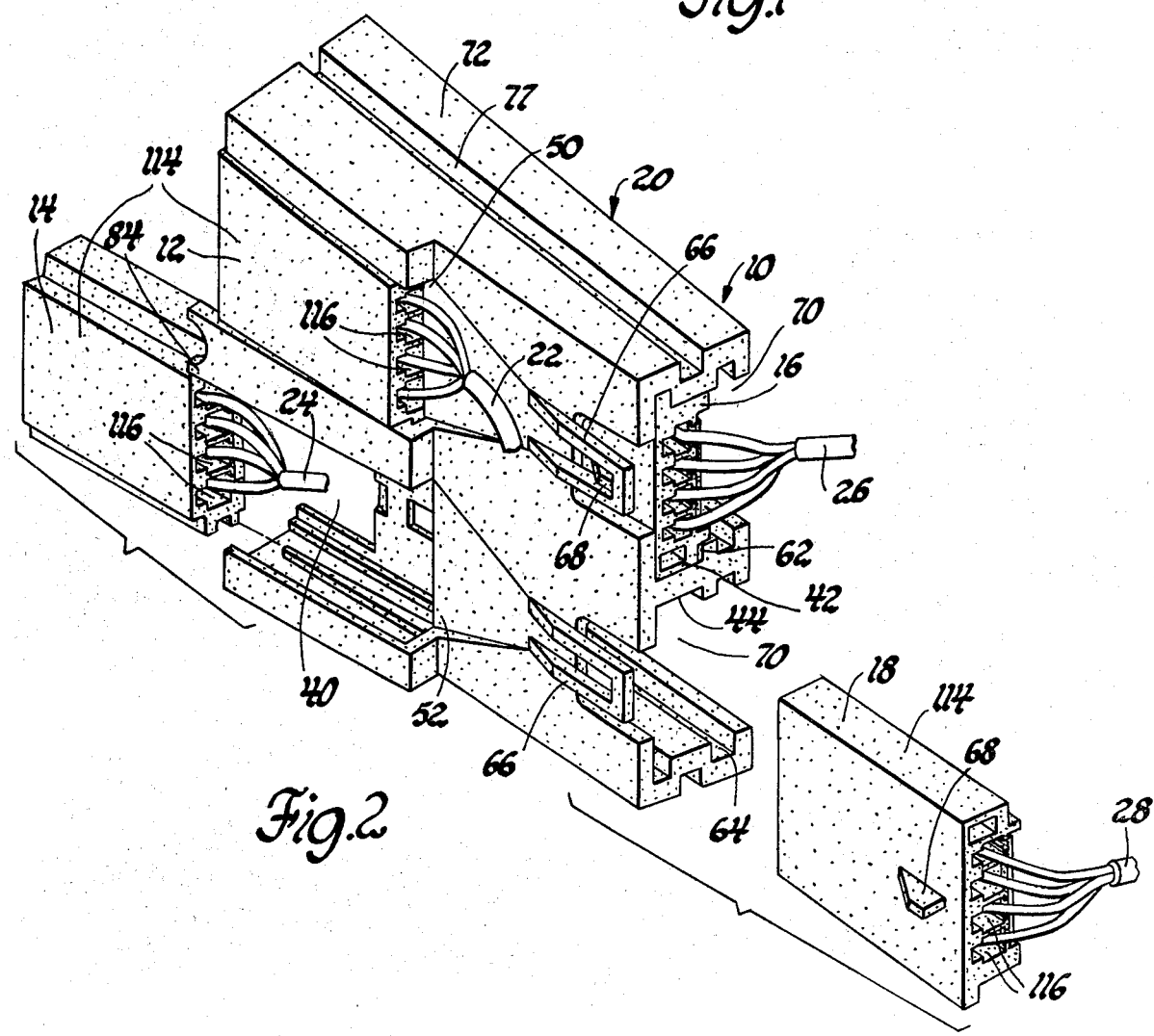
FIG. 2 is a partially exploded perspective view of the electrical connector shown in FIG. 1.

Referring now to the drawing, the electrical connector 10 comprises four connector blocks 12, 14, 16 and 18 which are arranged by a holder 20. Each of the connector blocks is attached to a respective one of the wiring harnesses 22, 24, 26 and 28 as shown in FIGS. 2 and 5. The holder 20 is mounted on the side wall 30 of a receptacle 32 which is integrated into the dash or instrument panel (not shown) of an automotive vehicle so that the open end of the receptacle 32 faces the passenger compartment. The receptacle 32 receives a slide-in radio 34 which has a side mounted terminal block 36 which mates with the electrical connector 10 when the radio 34 is mounted in the receptacle 32.

The holder 20 has four compartments 38, 40, 42 and 44 which receive the connector blocks 12, 14, 16 and 18 respectively. The compartments are disposed in two, longitudinally spaced vertical rows and arrange the connector blocks in the same manner when they are mounted in the compartments.

The two front compartments 38 and 40, each have a full front opening 46,48 at the front end of the holder 20 and a partial rear opening 50,52 between the front and rear ends of the holder.

The connector blocks 12 and 14 are inserted into the front compartments 38 and 40 through the full front openings 46 and 48 and seated against a partition 54 between the front and back compartments as shown in FIG. 4. The wiring harnesses 22 and 24 exit the front compartments 38 and 40 through the partial rear openings 50 and 52 as shown in FIGS. 2, 4 and 5. The front compartments 38 and 40 each have a partial floor 56 at their rearward end. The floor has a slot 58 which receives a lock tang 60 of the inserted connector block 12 or 14 to retain it in the associated front compartment (FIG. 4). The floor 56 and lock tang 60 are disposed on the mating side of the connector 10 and, consequently, the connector blocks 12 and 14 cannot be disconnected after the holder 20 is mounted on the receptacle 32 and the radio 34 is installed in the receptacle.

The two back compartments 42 and 44 each have a full rear opening 62,64 at the back end of the holder 20 and the holder 20 has a latch arm 66 associated with each of the back compartments as shown in FIGS. 1, 2, 4 and 5. The connector blocks 16 and 18 are inserted into the back compartments 42 and 44 through the rear openings 62 and 64 until they rest against the partition 54. Each of these connector blocks has a lock projection 68 which cooperates with a latch arm 66 of the holder 20 to retain it in its back compartment. The latch arms 66 and lock projections 68 are located on the external side of the connector 10 so that the connector blocks 16 and 18 can be connected or disconnected after the radio is installed.

The holder 20 has two longitudinal slots 70 in the mating side of the connector which extend from the front to the back of the holder. These two slots provide lateral openings for projecting portions of the terminal block 36 to protrude into each of the four compartments when the terminal block 36 is slid into the holder 20.

The holder 20 has two transverse side walls 72 and an interior longitudinal partition wall 74 which have longitudinal guide grooves 76 inside the holder. The guide grooves 76 taper in the rearward direction as shown in FIG. 6 and guide the terminal block 36 into the holder 20 when the radio 34 is installed. The two side walls 72 also have external longitudinal grooves 77 for mounting the holder 20 on the receptacle 32.

The rear portion of the receptacle 32 is cut-out as shown in FIG. 5 to provide two side rails 78 which are at the back of the receptacle 32 and displaced laterally inwardly from the side wall 30. The holder 20 is mounted on the receptacle 32 by inserting the holder 20 into the receptacle 32 through the cut-out, front end first, and then sliding the holder 20 back onto the side rails 78 until the holder 20 abuts the back wall 80 of the receptacle as shown in FIG. 5. The holder 20 is retained in this position in any suitable manner, such as a self-tapping screw (not shown) which is threaded into the slot 82 so that it blocks or threads into the front of the projection 84 on the holder 20.

The back wall 80 of the holder 20 has two slots 86 which are aligned with the respective rear openings 62 and 64 of the holder 20 so that the connector blocks 16 and 18 can be connected or disconnected after the holder 20 is mounted on the receptacle 32.

The terminal block 36 comprises a plastic, insulator base 90 which has four rectangular pads 92, 94, 96 and 98. The pads are arranged in two longitudinally spaced vertical rows in a pattern which complements the pattern of the holder compartments 38, 40, 42 and 44 and the connector blocks 12, 14, 16 and 18. The two front pads 92 and 94 project laterally outwardly of the two back pads 96 and 98 when the terminal block 36 is attached to the side of the radio 34 as shown in FIG. 5. The base 90 has outer vertical rails 102 and two sets of central vertical rails 104 which cooperate with the guide grooves 76 of the holder 20 to provide a slide mount for supporting one side of the radio 34 in the receptacle 32.

When the terminal block 34 and holder 20 are mated, the pads 92, 94, 96 and 98 are disposed in the respective compartments 38, 40, 42 and 44 and juxtaposed the respective connector blocks 12, 14, 16 and 18 as shown in FIGS. 3 and 4.

Each of the four pads carry four parallel terminal bars 106 in the form of flat, L-shaped, strips which abut two vertical sides of the pad and which are arranged in a horizontal, vertically spaced, pattern as shown in FIG. 5. Each of the terminal bars 106 are secured by a hook 108 at one end and a latch tang 110 near the opposite end which cooperate with suitably shaped portions of the terminal block 36. The terminal bars 106 have projecting tails 112 for electrical connection to a circuit board 113 inside the radio 34.

The connector blocks 12, 14, 16 and 18 are all about the same size and generally similar in construction. Each comprises a plastic connector body 114 which has four longitudinal terminal cavities 116 and a transverse slot 118 at the forward end which provides a lateral opening into each of the terminal cavities 116. Each of the terminal cavities contains a terminal 120 of the type shown in U.S. Pat. No. 3,365,694 granted to George W. Parker on Jan. 23, 1968. The terminal 120 is attached to one of the conductor wires of the associated wiring harness and has an elongated bow contact 122 which projects into the transverse slot 118. The contact bow 122 slideably engages one of the terminal bars 106 under a lateral bias when the connector 10 is mated to the terminal block 36 as shown in FIG. 4.

The embodiments of the invention in which an exclusive property or privilege is claimed are defined as follows:

1. An electrical connector for connecting a slide-in component to a plurality of related, remotely located components by a plurality of wiring harnesses comprising;

a terminal block mounted on a side of the slide-in component, said terminal block having a plurality of longitudinally spaced rows of terminal pads with each of the terminal pads being laterally offset from a longitudinally aligned terminal pad in another row, a receptacle for slideably receiving the slide-in component, a plurality of connector blocks attached to respective ones of a plurality of wiring harnesses, and means for arranging the connector blocks on a side wall of the receptacle in a plurality of longitudinally spaced rows with each of the connector blocks in one row being laterally offset from a longitudinally aligned connector block in another row, and said terminal pads and said connector blocks each having a plurality of terminals which engage terminals of the other when the slide-in component is mounted in the receptacle.

2. An electrical connector for connecting a slide-in component to a plurality of related, remotely located components by a plurality of wiring harnesses comprising;

a holder for longitudinally arranging first and second connector blocks attached to first and second wiring harnesses respectively, a front compartment in the holder having an opening at a front end of the holder for inserting the first connector block into the front compartment, a back compartment in the holder longitudinally aligned with and laterally offset from the front compartment to provide a partial opening between the ends of the holder for the first wiring harnes to exit the front compartment, and said back compartment having an opening at the back end of the holder for inserting the second connector block into the back compartment.

3. An electrical connector for connecting a slide-in radio or the like having a side mounted terminal block to a plurality of related, remotely located components by a plurality of wiring harnesses comprising, a receptacle for slideably receiving the radio longitudinally, said receptacle having a side wall adjacent the side mounted terminal block of the radio, a holder mounted on the side wall for longitudinally arranging a plurality of connector blocks attached to respective wiring harnesses, said holder having a contact side facing inwardly of the receptacle and an external side facing outwardly of the receptacle, a row of front compartments in the holder having longitudinal openings at the front end of the holder, a connector block in each front compartment which is insertable into the front compartment through the opening at the front end of the holder, means on the contact side of the holder for retaining the connector blocks in the front compartments, a row of back compartments in the holder which is laterally offset from the row of front compartments to provide partial openings between the ends of the holder for wiring harnesses to exit the front compartments, said back compartments having longitudinal openings at the back end of the holder, a connector block in each back compartment which is insertable into the back compartment through the opening at the back end of the holder, and means on the external side of the holder for retaining the connector blocks in the rear compartments.

* * * * *